(12) United States Patent
Karon et al.

(10) Patent No.: US 11,525,686 B2
(45) Date of Patent: Dec. 13, 2022

(54) CROWD SOURCED MULTI-STAGE MOBILE DEVICE FINGERPRINT BASED NAVIGATION

(71) Applicant: MAPSTED CORP., Mississauga (CA)

(72) Inventors: Joshua Karon, Toronto (CA); Sean Huberman, Guelph (CA)

(73) Assignee: MAPSTED CORP., Mississauga (CA)

( * ) Notice: Subject to any disclaimer, the term of this patent is extended or adjusted under 35 U.S.C. 154(b) by 571 days.

(21) Appl. No.: 16/587,362

(22) Filed: Sep. 30, 2019

(65) Prior Publication Data

US 2021/0095967 A1 Apr. 1, 2021

(51) Int. Cl.
*G01C 21/20* (2006.01)
*H04W 4/33* (2018.01)
*H04W 4/029* (2018.01)
*G01R 33/10* (2006.01)
*H04B 17/318* (2015.01)
*H04W 4/021* (2018.01)
*H04W 4/024* (2018.01)

(52) U.S. Cl.
CPC .......... *G01C 21/206* (2013.01); *G01R 33/10* (2013.01); *H04B 17/318* (2015.01); *H04W 4/021* (2013.01); *H04W 4/024* (2018.02); *H04W 4/029* (2018.02); *H04W 4/33* (2018.02)

(58) Field of Classification Search
CPC ..... G01C 21/206; G01R 33/10; H04W 4/021; H04W 4/029; H04W 4/33; H04B 17/318
USPC ....................................................... 701/519
See application file for complete search history.

(56) References Cited

U.S. PATENT DOCUMENTS

| | | | |
|---|---|---|---|
| 6,539,327 B1 | 3/2003 | Dassot et al. | |
| 8,849,308 B2* | 9/2014 | Marti | H04W 4/029 |
| | | | 455/456.2 |
| 8,934,921 B2* | 1/2015 | Marti | G01S 5/02 |
| | | | 701/445 |
| 8,977,298 B2* | 3/2015 | Marti | H04W 4/021 |
| | | | 455/435.2 |
| 9,002,373 B2* | 4/2015 | Marti | H04W 24/00 |
| | | | 370/332 |
| 9,170,112 B2 | 10/2015 | Mirov et al. | |
| 9,226,111 B2* | 12/2015 | Marti | H04W 4/029 |
| 9,557,178 B2 | 1/2017 | Ghose et al. | |
| 10,890,450 B1* | 1/2021 | Karon | H04W 4/33 |
| 11,287,492 B2* | 3/2022 | Ring | G01D 5/145 |
| 11,290,590 B2* | 3/2022 | Lee | H04M 1/72451 |
| 11,292,132 B2* | 4/2022 | Mao | B25J 9/1697 |
| 11,292,460 B2* | 4/2022 | Ishioka | B60W 30/095 |
| 2009/0043504 A1 | 2/2009 | Bandyopadhyay et al. | |
| 2013/0150076 A1 | 6/2013 | Kim et al. | |
| 2013/0162481 A1 | 6/2013 | Parvizi et al. | |

(Continued)

*Primary Examiner* — Yazan A Soofi

(57) ABSTRACT

A method and system for deploying a calibrated positioning map of an area. The method, executed in a processor of a server computing device, comprises deploying a crowd sourced magnetic fingerprint map for mobile device localization during traversal of the indoor area, accumulating received signal strength (RSS) measurements in forming a RSS fingerprint map using crowd sourced RSS measurements during the deploying, and switching, responsive to identifying desirability of a change in the mobile device localization within the indoor area, from the crowd sourced magnetic fingerprint map to the RSS fingerprint map as basis for localizing the mobile device.

20 Claims, 4 Drawing Sheets

(56) References Cited

U.S. PATENT DOCUMENTS

| | | |
|---|---|---|
| 2014/0180627 A1 | 6/2014 | Naguib et al. |
| 2015/0018018 A1 | 1/2015 | Shen et al. |
| 2016/0011022 A1 | 1/2016 | Zheng et al. |
| 2016/0379074 A1 | 12/2016 | Nielsen et al. |
| 2017/0265041 A1 | 9/2017 | Mahasenan et al. |
| 2018/0356475 A1 | 12/2018 | Eitel et al. |

\* cited by examiner

400

```
┌─────────────────────────────────────────────────────────────────┐
│ Deploying a crowd sourced magnetic fingerprint map for mobile   │
│ device localization during traversal of the indoor area         │
│                                                             410 │
└─────────────────────────────────────────────────────────────────┘
                                 │
                                 ▼
┌─────────────────────────────────────────────────────────────────┐
│ Accumulating received signal strength (RSS) measurements in     │
│ forming a RSS fingerprint map using crowd sourced RSS           │
│ measurements during the deploying                               │
│                                                             420 │
└─────────────────────────────────────────────────────────────────┘
                                 │
                                 ▼
┌─────────────────────────────────────────────────────────────────┐
│ Switching, responsive to identifying desirability of a change in│
│ the mobile device localization within the indoor area, from the │
│ crowd sourced magnetic fingerprint map to the RSS fingerprint   │
│ map as basis for localizing the mobile device               430 │
└─────────────────────────────────────────────────────────────────┘
```

FIG. 4

CROWD SOURCED MULTI-STAGE MOBILE DEVICE FINGERPRINT BASED NAVIGATION

TECHNICAL FIELD

The disclosure herein relates to the field of mobile device navigation and positioning.

BACKGROUND

Users of mobile devices are increasingly using and depending upon indoor positioning and navigation applications and features. Seamless, accurate and dependable indoor positioning can be difficult to achieve using satellite-based navigation systems when the latter becomes unavailable or sporadically available, such as within enclosed or partly enclosed urban infrastructure and buildings, including hospitals, shopping malls, airports, universities and industrial warehouses. To address this problem, indoor navigation solutions increasingly rely on sensors received signal strength (RSS) sensors, magnetometers and inertial sensors including accelerometers, gyroscopes, which may be commonly included in mobile phones and other mobile devices. Wireless communication scans in particular may consume relatively high amounts of mobile device power, and in some cases the frequency of scans may be restricted by mobile device operating systems, especially during the calibration phase where a large amount of RSS data needs to be collected.

BRIEF DESCRIPTION OF THE DRAWINGS

FIG. 4 illustrates, in an example embodiment, a method of operation of a multi-staged fingerprint map system for mobile device navigation.

DETAILED DESCRIPTION

Figure 1:
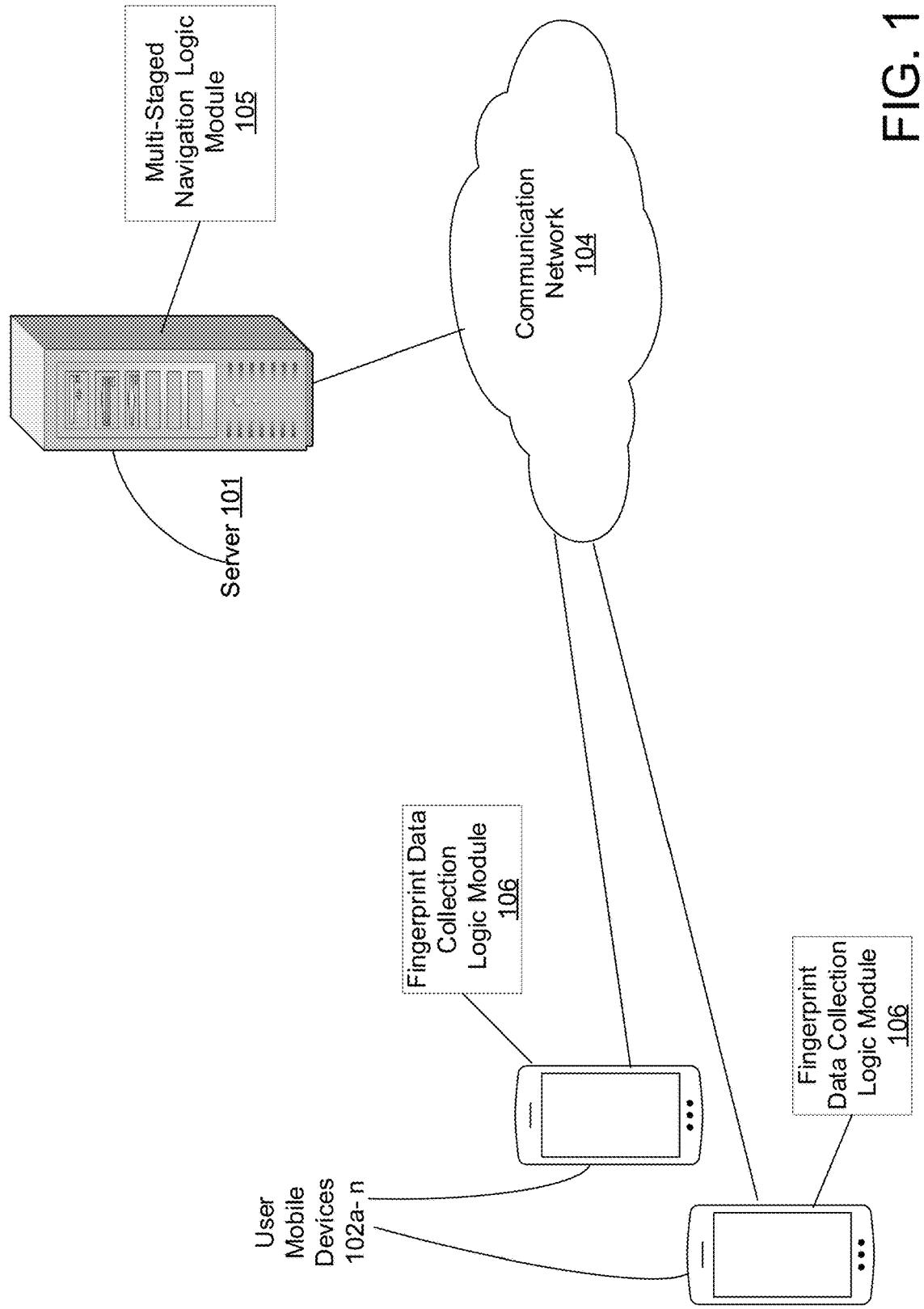
FIG. 1 illustrates, in an example embodiment, a system for generating and deploying a calibrated positioning map of an area.

The majority of indoor navigation systems require some form of system calibration prior to going live upon deployment. The most typical type of calibration for positioning, also referred to herein as navigation, is fingerprinting. The term fingerprint, variously referred to herein as calibration fingerprint, fingerprint map and fingerprint data, in one embodiment constitutes any combination of time-correlated, individual measurements of received wireless communication signal strength information (RSS), magnetic field information (strength, direction, dip angle) or barometric pressure information at known, fixed locations within an area, including an indoor area. In other words, a fingerprint includes a correlation of sensor and signal information, including, but not necessarily limited to wireless signal strength, magnetic, barometric and inertial sensor information, at a given instance in time, at a unique position along a sequence of positions that constitute a navigation path traversed by the mobile device. Additionally, given that sampling times and sampling rates applied to particular device sensors may be different, the signal and sensor information as measured may be time-averaged across particular periods of time, with the time-averaged value being used to represent the signal information at any given instance of time within that particular period of time in which the signal information is time-averaged.

Among other benefits and technical effect, embodiments provided herein alleviate the bottleneck imposed by a fingerprint calibration mapping process as a prerequisite to deployment of indoor navigation and positioning solutions, and enable more rapid deployment, and easier scalability, of an indoor navigation solution by utilizing a crowd-sourcing based alternative approach. The initial calibration of a positioning fingerprint dataset or map based on the magnetic field parameters is used a stepping stone to crowd source RSS data and create a sufficiently dense RSS data radio fingerprint map. Next, when the magnetic field calibration is decided as being no longer up to date and sufficiently accurate, the RSS data is used to crowd source magnetic field parameter fingerprint updates.

In order to ensure sufficiently high accuracy of an indoor positioning or navigation solution, many individual fingerprint measurements must be taken at many locations within an area during the fingerprint calibration and mapping process. Since each such measurement may typically take at least several minutes at each location or position, the fingerprint calibration and mapping process therefore constitutes a highly labor- and time-intensive, expensive limiting barrier to deployment and scalability of indoor navigation solutions.

In particular regard to RSS fingerprint data acquisition, wireless communication scans in particular may consume relatively high amounts of mobile device power. In some cases, especially during the calibration phase where a large amount of RSS data needs to be collected, the frequency of scans may be restricted by mobile device operating systems, as among other reasons, excessive power consumption may adversely reflect on brand providers of mobile devices.

More specifically, in the crowd sourcing-based approach, users may be provided an indoor positioning mobile device application, and may be encouraged to walk around the area of interest, such as an indoor shopping mall. At various known, fixed locations within the area, events, also referred to herein as occurrence events, may be triggered and logged. Based on the logged data, an offline estimation of the user trajectory may be determined, and corresponding to known fixed locations, fingerprint measurements may be correlated with respective indoor locations along a trajectory, or trajectory segments, along which a user's mobile device traverses while within the area. As more trajectories from numerous other users are accumulated and logged, the averaging of user results may be used to accomplish a fingerprint mapping of the area or region.

In particular, the crowd sourcing based embodiments described here advantageously avoid the need for tedious and expensive specially-purposed, dedicated calibration fingerprint mapping, and result in a more accurate calibration fingerprint map representation of the targeted environment. Users incentives, for example, may be offered, to encourage random mobile device users to participate using their mobile device indoor navigation application. Among other technical effects and benefits of the efficient, easy-to-deploy, scalable crowd sourced-based solution to indoor navigation calibration described herein, utilizing known fixed locations within the target area or building allows for more accurate interpolation and reconstruction of the user's mobile device trajectory, or a trajectory segment, resulting in a more accurate construction of fingerprints and associated fingerprint map, than can be provided by a dedicated calibration mapping of wireless beacon signal strengths, for example.

Provided herein is a method and system of crowd sourced multi-staged mobile device fingerprint based localization and navigation. The method, executed in a processor of a server computing device, comprises deploying a crowd sourced magnetic fingerprint map for mobile device localization during traversal of the indoor area, accumulating received signal strength (RSS) measurements in forming a RSS fingerprint map using crowd sourced RSS measurements during the deploying, and switching, responsive to identifying desirability of a change in the mobile device localization within the indoor area, from the crowd sourced magnetic fingerprint map to the RSS fingerprint map as basis for localizing the mobile device.

Also provided is a server computing system for crowd sourced multi-staged mobile device fingerprint based localization and navigation. The server includes a processor and a memory. The memory includes instructions executable in the processor to deploy a crowd sourced magnetic fingerprint map for mobile device localization during traversal of the indoor area; accumulate received signal strength (RSS) measurements in forming a RSS fingerprint map using crowd sourced RSS measurements during the deploying; and switch, responsive to identifying desirability of a change in the mobile device localization within the indoor area, from the crowd sourced magnetic fingerprint map to the RSS fingerprint map as basis for localizing the mobile device.

One or more embodiments described herein provide that methods, techniques, and actions performed by a computing device are performed programmatically, or as a computer-implemented method. Programmatically, as used herein, means through the use of code or computer-executable instructions. These instructions can be stored in one or more memory resources of the computing device. A programmatically performed step may or may not be automatic.

One or more embodiments described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Some embodiments described herein can generally require the use of computing devices, including processor and memory resources. For example, one or more embodiments described herein may be implemented, in whole or in part, on computing devices such as servers, desktop computers, mobile devices including cellular or smartphones, laptop computers, wearable devices, and tablet devices. Memory, processing, and network resources may all be used in connection with the establishment, use, or performance of any embodiment described herein, including with the performance of any method or with the implementation of any system.

Furthermore, one or more embodiments described herein may be implemented through the use of instructions that are executable by one or more processors. These instructions may be carried on a computer-readable medium. Machines shown or described with figures below provide examples of processing resources and computer-readable mediums on which instructions for implementing embodiments of the invention can be carried and/or executed. In particular, the numerous machines shown with embodiments of the invention include processor(s) and various forms of memory for holding data and instructions. Examples of computer-readable mediums include permanent memory storage devices, such as hard drives on personal computers or servers. Other examples of computer storage mediums include portable memory storage units, flash memory (such as carried on smartphones, multifunctional devices or tablets), and magnetic memory. Computers, terminals, network enabled devices (e.g., mobile devices, such as cell phones) are all examples of machines and devices that utilize processors, memory, and instructions stored on computer-readable mediums. Additionally, embodiments may be implemented in the form of computer-programs, or a computer usable carrier medium capable of carrying such a program.

System Description

FIG. 1 illustrates, in an example embodiment, a system 100 for generating and deploying a calibrated positioning map of an area, including but not limited to an indoor area. Server computing device 101, also referred to herein as server 101, includes multi stage navigation logic module 105, and is communicatively connected via communication network 104 to a plurality of computing and communication mobile devices 102a-n, also referred to herein as mobile device(s) 102a-n. Mobile devices 102a-n include fingerprint data collection logic module 106, which in one embodiment, may be included in an indoor positioning, or indoor navigation, software application downloaded and installed at individual ones of mobile devices 102a-n.

Figure 2:
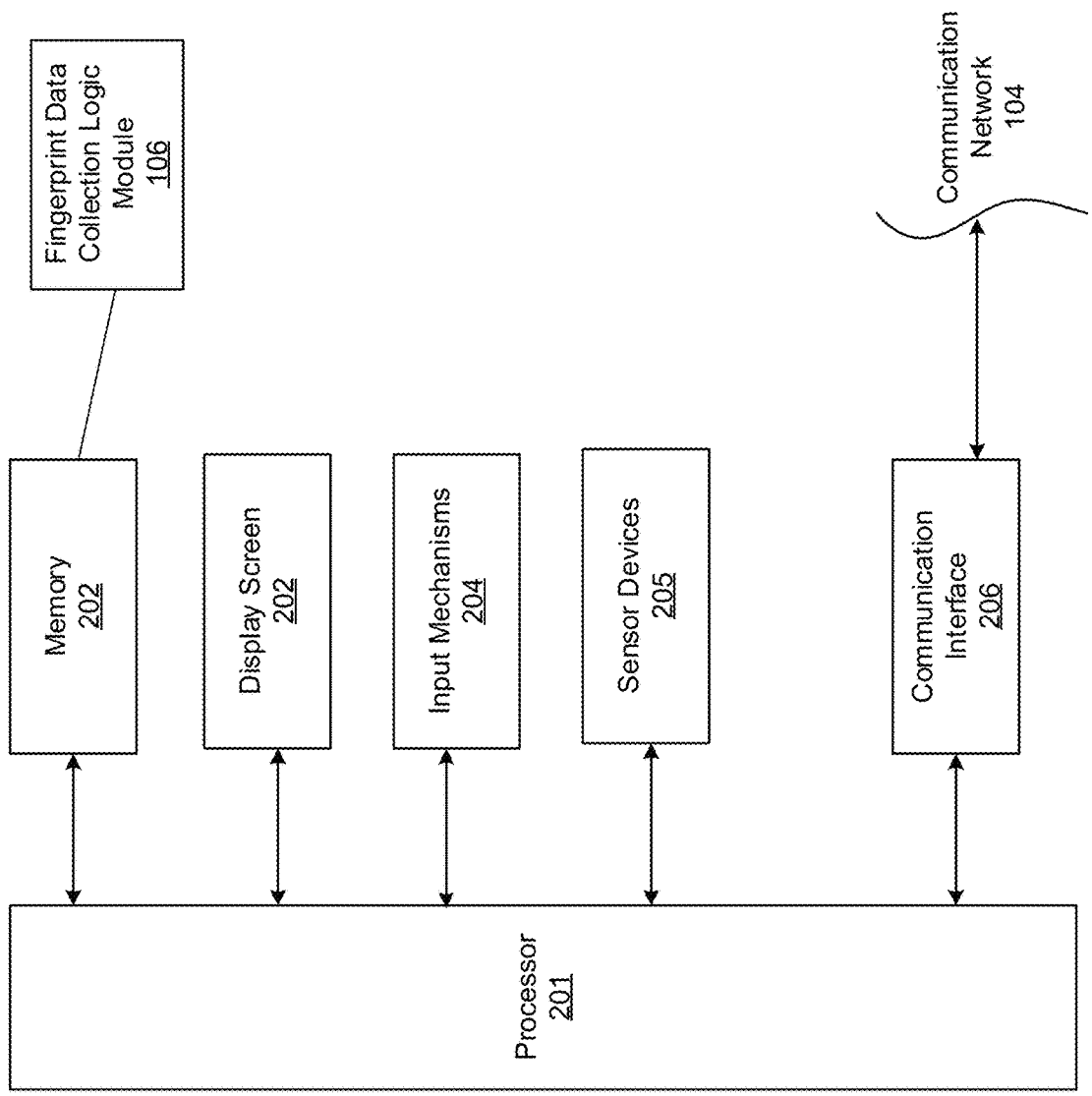
FIG. 2 illustrates an example architecture of a computing and communication mobile device for data collection using the mobile device.

FIG. 2 illustrates an example architecture 200 of computing and communication mobile devices 102a-n used for fingerprint data collection. As used herein, the term mobile device 102 refers to any singular mobile device among mobile devices 102a-n. In one embodiment, mobile device 102 may correspond to, for example, a cellular communication device (e.g., smartphone, tablet, etc.) that is capable of telephony, messaging, and/or data computing services. In variations, mobile device 102 can correspond to, for example, a tablet or a wearable computing device. Mobile device 102 may include processor 201, memory 202, display screen 203, input mechanisms 204 such as a keyboard or software-implemented touchscreen input functionality, barcode, QR code or other symbol- or code- scanner input functionality. Mobile device 102 may include sensor functionality by way of sensor devices 205. Sensor devices 205 may include any of inertial sensors (accelerometer, gyroscope), magnetometer or other magnetic field sensing functionality, barometric or other environmental pressure sensing functionality, and received signal strength (RSS) sensors relating to wireless communication signals. Mobile device 102 may also include capability for detecting and communicatively accessing wireless communication signals, including but not limited to any of Bluetooth, Wi-Fi, RFID, and GPS signals. Mobile device 102 further includes the capability for detecting and measuring a received signal strength of the wireless communication signals. In particular, mobile device 102 may include location determination capability such as by way of GPS module 205, and communication interface 206 for communicatively coupling to communication network 104, such as by sending and receiving cellular data over data channels and voice channels.

Fingerprint data collection logic module 106 includes instructions stored in memory 202 of mobile device 102. In embodiments, fingerprint data collection logic module 106 may be included in a mobile device navigation application program stored in memory 202 of mobile device 102 for acquiring fingerprint data within an area by any of plurality of mobile devices 102a-n. The area may be an indoor area within a shopping mall, an airport, a warehouse, a university, or any at least partially enclosed building. Acquisition of the fingerprint data may be automatically triggered at respective ones of mobile devices 102a-n upon an event occurrence. The event occurrence may consist of a user of mobile device 102 redeeming a promotion coupon at a merchant within a shopping mall, scanning a barcode, using an RFID tag, or upon the mobile device 102 becoming present at specific predetermined locations within the area. The occurrence event may be also based on detecting an access point wireless signal as deployed in indoor infrastructure, in some examples. Acquisition of the fingerprint data by a user's mobile device 102 may thus be automatically triggered upon the event occurrence at any predetermined set of fixed positions within the area.

The terms fingerprint and fingerprint data as used herein refer to time-correlated, time-stamped individual measurements of any of, or any combination of, received wireless communication signal strength or RSS parameters, and signal connectivity parameters, magnetic field parameters (strength, direction, dip angle) or barometric pressure parameters, and mobile device inertial sensor data at known, particular locations along a route being traversed, and also anticipated for traversal, by the mobile device. In other words, a fingerprint as referred to herein may include a correlation of sensor and signal information (including, but not necessarily limited to wireless signal strength, wireless connectivity information, magnetic or barometric information, inertial sensor information and GPS location information) associated for a unique location relative to the facility in accordance with a particular time stamp of gathering the set of mobile sensor data by time correlating the mobile device gyroscope data, the mobile device accelerometer data, mobile device magnetometer data and any other applicable mobile device sensor data, for example. Thus, fingerprint data associated with a particular location or position may provide a fingerprint signature that uniquely correlates to that particular location or position. A sequence of positions or locations that constitute a navigation path traversed by the mobile device relative to a given indoor facility may be fingerprint- mapped during a calibration process, and the resulting fingerprint map stored in a fingerprint data repository of server 101. Server 101 may store respective fingerprint maps of various buildings and indoor areas. The respective building or indoor facility fingerprint maps, or any portions thereof, may be downloaded into a memory of mobile device 102 for use in conjunction with the pedestrian navigation software application executing thereon.

In embodiments, magnetic fingerprint information of the fingerprint map may be susceptible to frequent changes encountered in an indoor navigation environment. The magnetic characteristics of the earth's magnetic field may vary in different zones of a given building given the presence of steel structural elements, ferromagnetic objects and the electronic equipment typically contained there. Such elements perturb the earth's magnetic field which may provide the potential for distinguishing unique locations or positions inside the buildings. In general, a non-uniform indoor ambient magnetic field produces different magnetic observations depending on the path taken through it. Static objects or infrastructures inside buildings, such as steel structures, electric power systems and electronic and mechanical appliances, perturb the earth's magnetic field in a manner that establishes a profile of magnetic field values that constitute a map composed of magnetic field fingerprints. Certain elements inside buildings can distort or attenuate the relatively weak direction of the earth's magnetic field. Magnetic field perturbation as sensed or measured at a given location, for example by way of one or more of a magnetic field strength, a magnetic direction and a magnetic angle, within the building may decrease rapidly as the distance from an interfering source increases. The size of the object responsible for the interference has a direct impact on the perturbation generated. More specifically, the larger the object, the greater the distance needed for the perturbation to decrease. It is contemplated that such changes over time may adversely affect the accuracy of magnetic fingerprint calibration data, and thus affect the accuracy of positioning results in mobile device navigation.

In crowd-sourced embodiments, a user of mobile device 102 may, in effect, passively assist in the positioning calibration process by acquiring fingerprint data, then allowing uploading or other transfer of the acquired fingerprint data to server 101 for further processing. The fingerprint data may be acquired at least in part using sensor devices 205 of the mobile devices, including but not limited to an accelerometer, a gyroscope, a magnetometer, a barometer, and a wireless signal strength sensor. The fingerprint data may include any one of orientation data, a magnetic field data including strength, dip angle and direction, received wireless signal strength data, barometric pressure data, and also GPS location data at a position within the area for respective mobile devices.

As the fingerprint data acquired at mobile device 102 is time-stamped and the data collection via fingerprint data collection logic module 106 operates in a distributed manner, the fingerprint data may be cached on the local memory 202 and subsequently batch transferred as a compressed data file for post-processing at server 101, in some embodiments. Fingerprint data collection logic module 106, in effect, operates to pre-process fingerprint data and extract key features which can assist in the mobile device 102 trajectory reconstruction during the post processing step at server 101. The pre-processing step at fingerprint data collection logic module 106 may include counting the number of steps taken by a user of mobile device 102, estimating the step length of each step, estimating the heading direction for each step, as well as, recording the time-averaged and time-stamped magnetic field information and wireless radio signals, and monitoring for, and logging, occurrence of any triggered event/tag-based data that enables the trajectory of mobile device 102 to be best matched a physical map of the area that includes known fixed objects at unique locations.

Using changes in magnetic field measurements together with received signal strength (RSS) measurements can provide precise indoor positioning. RSS is normally viewed as the foundation of indoor positioning systems, however, due to relatively high device power consumption among other reasons, it may difficult to collect enough data to accumualte a sufficiently fingerprint radio map over a short period of time. Magnetic field data can be a very precise indicator of indoor location, but it is subject to temporal decorrelation, as relative small changes in the indoor environment can cause large changes to the magnetic field, adversely affecting accuracy of the accumulated magnetic fingerprint databse Additionally, collection of magnetic information is not limited by mobile devices for the reasons RSS scanning and collecting is limited. Therefore, a large amount of magnetic calibration data can be collected over a much shorter period of time.

The differences between magnetic and RSS data may be described as follows:

|  | Easy Collection | Permanent Signals |
|---|---|---|
| RSS | No | Yes |
| Magnetic | Yes | No |

In embodiments, proposed solutions herein combine the collection of magnetic and RSS data as a multi stage process in order to obtain a dense RSS radio fingerprint map and preform updates to the magnetic field measurements of the magnetic fingerprint map.

Crowd sourcing can be an efficient way of collecting a lot of data in a short amount of time. However, the difficulty of crowd sourcing is in estimating the location of the user at the time measurement.

A full calibration of the magnetic field is performed. Some RSS data may be collected as well but the desired or practically desirable density of radio data will not be achieved yet, due to restrictions imposed on the mobile phone, for instance.

Next the indoor positioning platform will become available to many users. Positioning will be mainly based on the magnetic field calibration fingerprint databse because the magnetic calibration will be complete and up to date. Based on the position estimates of the users RSS can be crowd-source collected to achieve a dense radio map, over a significant period of time, longer than would be required for magnetic fingerprint map calibration. Thus, the magnetic calibration starts the multi-stage calibration and fingerprint map deployment for mobile device navigation as provided herein.

Over time the magnetic field calibration will progressively become outdated. During this final stage the dense RSS radio map can in turn be used to provide positioning in order to preform crowd source updates of the magnetic field measurements. In embodiments, observations of mobile localization accuracy, or adverse trends in accuracy, may be used to detect or infer that the magnetic fingerprint map is out of date. In other embodiments, this may be inferred from passage of time, for example 3-6 months in range. Viability of an existing magnetic fingerprint map may be highly dependent on the environment. For example, if it is in a hospital it will constantly be changing because all of those medical devices have ambient magnetic fields and they get moved on a near daily basis. Basically, anytime the environment is being adjusted, it may have an effect on the magnetic fingerprint. So for some deployments, for example a conference center, where they may setup some booths and those booths are active for 5 days (e.g., conference duration) and then taken down. But also, when the positioning is only required to be in use for such relatively limited timeframe, we can be more confident in using ambient magnetic fields and trusting them since we only care about a short term deployment. For long-term deployments, we need to be more cautious when dealing with the potential effects of short-term magnetic fields. For example, in a shopping center, kiosks can give off magnetic fields and they do change from time to time but not on a daily basis. So, these are example aspects that can be learned over time and adjusted. In yet another example, if many users walk past a given location where we would have expected to see a certain magnetic disturbance (for instance, due to a kiosk that used to be in, or proximate, that location), we may be able to infer that it is no longer there, and update the magnetic fingerprint accordingly.

Figure 3:
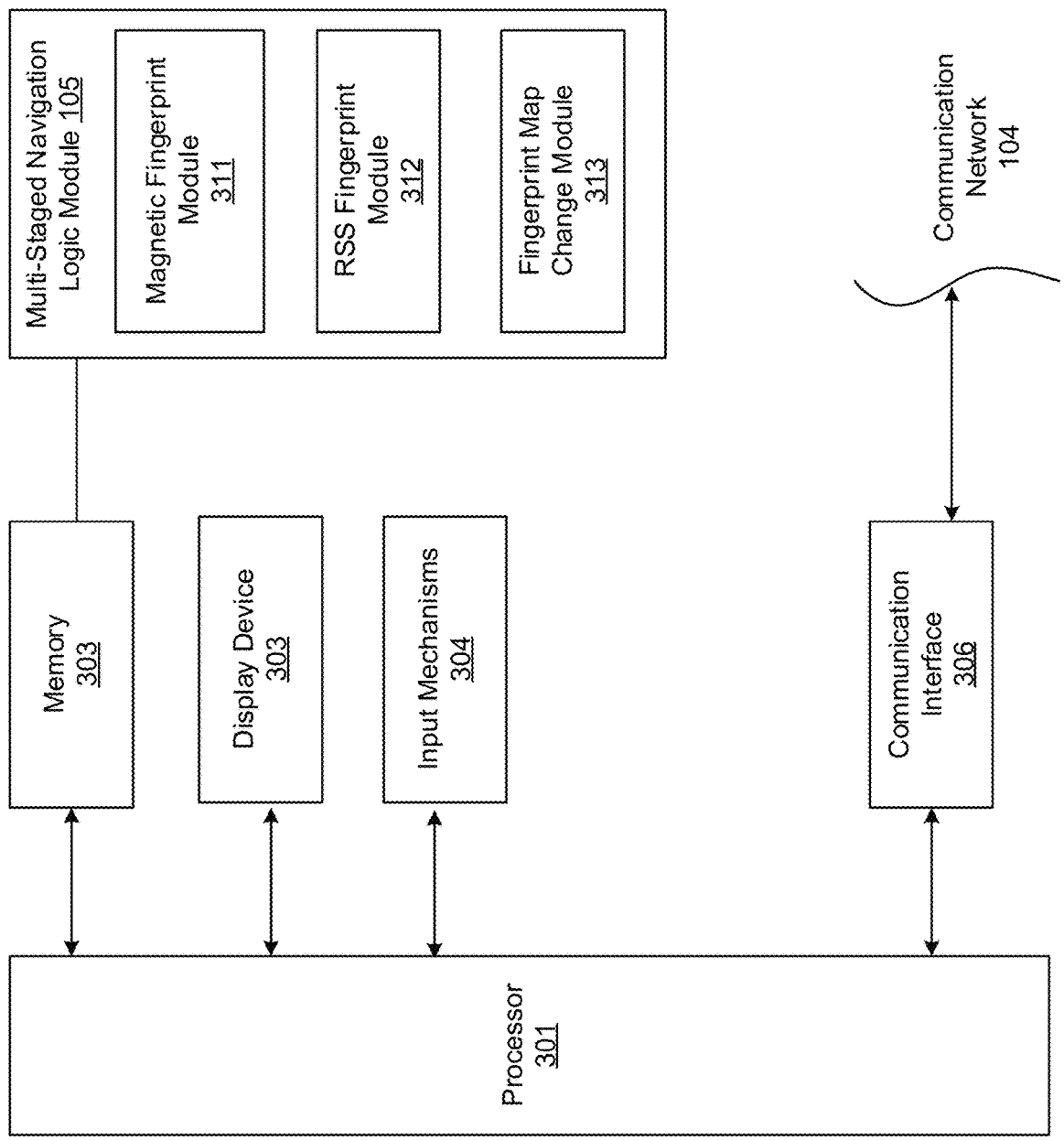
FIG. 3 illustrates an example architecture of a server computing device for generating and deploying multi-staged fingerprint map for mobile device navigation.

FIG. 3 illustrates an example architecture 300 of a server computing device 101 for generating and deploying multi-staged fingerprint for mobile device navigation. Server 101, in an embodiment architecture, may be implemented on one or more server devices, and includes processor 301, memory 302 which may include a read-only memory (ROM) as well as a random access memory (RAM) or other dynamic storage device, display device 303, input mechanisms 304 and communication interface 306 for communicative coupling to communication network 104. Processor 301 is configured with software and/or other logic (such as from positioning calibration logic module 105) to perform one or more processes, steps and other functions described with implementations, such as described by FIGS. 1 through 4 herein. Processor 301 may process information and instructions stored in memory 302, such as provided by a random access memory (RAM) or other dynamic storage device, for storing information and instructions which are executable by processor 301. Memory 302 also may be used for storing temporary variables or other intermediate information during execution of instructions to be executed by processor 301. Memory 302 may also include the ROM or other static storage device for storing static information and instructions for processor 301; a storage device, such as a magnetic disk or optical disk, may be provided for storing information and instructions. Communication interface 306 enables server 101 to communicate with one or more communication networks 104 (e.g., cellular network) through use of the network link (wireless or wired). Using the network link, server 101 can communicate with computing devices 102a-n.

Multi stage fingerprint navigation logic module 105 of server 101 may include instructions stored in RAM of memory 302, and includes magnetic fingerprint module 311, RSS fingerprint module 312, and fingerprint map change module 313.

Processor 301 uses executable instructions stored in magnetic fingerprint module 311 to deploy a crowd sourced magnetic fingerprint map for mobile device localization during traversal of the indoor area. The area may be an indoor area within a shopping mall, an airport, a warehouse, a university, or any at least partially enclosed building. In embodiments, the fingerprint data, as acquired from mobile devices 102a-n, further includes respective time-stamps, whereby the orientation, the magnetic field strength and direction, the received wireless signal strength, the barometric pressure, and the position data can be time-correlated for any given position along a trajectory or trajectory segment of the mobile devices, in accordance with the respective time-stamps. Additionally, when the sampling times and sampling rates applied to particular ones of device sensors 205 are different, the signal and sensor information as measured may be time-averaged across particular periods of time, with the time-averaged value being used to represent the signal information at any given instance of time within that particular period of time in which the signal information is time-averaged.

Processor 301 uses executable instructions stored in RSS fingerprint module 312 to accumulate received signal strength (RSS) measurements in forming a RSS fingerprint map using crowd sourced RSS measurements during the deploying. The term "position" as used herein refers to a coordinate location, and may be expressed in local or global (X, Y) coordinate terms. In some embodiments, the coordinates may further include a Z coordinate representing a height, for example associated with a given floor within a multi-floor building, and thus expressed in (X, Y, Z) coordinate terms. Further processing, via the instructions constituting RSS fingerprint module 312 executable in processor 301, may apply for a second set of fingerprint data and the calibrated data points to generate an updated distribution of calibrated data points. The processing to generate the distribution of calibrated data points may include matching the fingerprint data based at least partly on the correlations, amalgamating the matched data from respective ones of the plurality of mobile devices 102a-n and any additional mobile devices into a cumulative calibration dataset. Then generating, based on the cumulative calibration dataset, the distribution of calibrated data points mapped to respective positions within the area.

RSS fingerprint module 312 operates in post- processing of the fingerprint data at server 101. Specifically, the ability to accurately post-process the user data to identify trajectories or trajectory-segments of the mobile devices 102a-n in which time-stamped user positions are known with sufficient reliability. Then, by linking the known time-stamped user positions with the time-stamped measured sensor devices 205 data, calibration data points are formed. As more users cumulatively enter the system, the accumulative amalgamation of crowd-sourced, multi-users' calibration points forms a distribution over the targeted area, such as an indoor area of a shopping mall.

Processor 301 uses executable instructions stored in fingerprint map change module 313 to switch, responsive to identifying desirability of a change in the mobile device localization within the indoor area, from the crowd sourced magnetic fingerprint map to the RSS fingerprint map as basis for localizing a mobile device. A density determination algorithm may be applied, in one embodiment, to establish the predetermined threshold density based on validating the updated distribution of calibrated data points as sufficient for deployment, representing the calibrated position map of the area. In another embodiment, the threshold density for deployment may be dynamically determined, and dynamically updated, based on updating at least one of the density of calibration data points and the consistency amongst the calibration data points relative to a neighboring area contiguous with the target area. Dynamically updating the threshold density in the latter manner allows the system to automatically detect and correct potential calibration inconsistencies prior to deploying the calibrated positioning map of the area. The density determination algorithm may be employed in conjunction with an artificial neural network to validate when a sufficient number of fingerprint calibration data points have been collected and accumulated for specific areas or regions within the areas. In particular, this process can also assist in identifying pedestrian traffic patterns and traffic densities for particular areas and times within the area or the shopping mall, as well as to provide the capability to assess whether or not a sufficient amount of data has been collected to complete the calibration process. In the present embodiment, the one-time artificial neural network processing initializes the fingerprint data. Moreover, based on the artificial neural network processing, a dynamic incremental fingerprint updating scheme may be employed to dynamically maintain up-to-date fingerprint calibration data sets.

Methodology

FIG. 4 illustrates, in an example embodiment, a method 400 of operation of a multi-staged fingerprint system 100 for mobile device navigation. In describing examples of FIG. 4, reference is made to the examples of FIGS. 1-3 for purposes of illustrating suitable components or elements for performing a step or sub-step being described.

Examples of method steps described herein are related to the use of server 101, variously referred to herein as server 101, for implementing the techniques described herein. According to one embodiment, the techniques are performed by positioning calibration logic module 105 of server 101 in response to the processor 301 executing one or more sequences of software logic instructions that constitute calibration logic module 105. In embodiments, calibration logic module 105 may include the one or more sequences of instructions within sub-modules including magnetic fingerprint module 311, RSS fingerprint module 312 and fingerprint map change module 313. Such instructions may be read into memory 302 from machine-readable medium, such as memory storage devices. Execution of the sequences of instructions contained in magnetic fingerprint module 311, RSS fingerprint module 312 and fingerprint map change module 313 of calibration logic module 105 in memory 302 causes processor 301 to perform the process steps described herein. In alternative implementations, at least some hardwired circuitry may be used in place of, or in combination with, the software logic instructions to implement examples described herein. Thus, the examples described herein are not limited to any particular combination of hardware circuitry and software instructions.

At step 410, deploying a crowd sourced magnetic fingerprint map for mobile device localization during traversal of the indoor area. The area may be an indoor area within a shopping mall, an airport, a warehouse, a university, a hospital or any at least partially enclosed building. Acquisition of the first and second sets of fingerprint data may be automatically triggered at respective mobile devices upon an event occurrence. The event occurrence may consist of a user redeeming a coupon at a merchant within a shopping mall, scanning a barcode, using an RFID tag, or may be based on accessibility of a proximity beacon wireless signal, in some examples. Acquisition of the fingerprint data by a user's mobile device may thus be automatically triggered upon the event occurrence at any one of a predetermined set of fixed positions within the area. In this manner, a user of mobile device 102 may, in effect, passively assist in the positioning calibration process by acquiring fingerprint data, then allowing uploading or other transfer of the acquired fingerprint data to server 101 for further processing. The fingerprint data may be acquired using sensor devices 205 of the mobile devices, including but not limited to an accelerometer, a gyroscope, a magnetometer, a barometer, and a wireless signal strength sensor. The fingerprint data may include any one of an orientation, a magnetic field strength and direction, a magnetic dip angle, a received wireless signal strength, a barometric pressure, at a position within the area for respective mobile devices.

In embodiments, the fingerprint data, as acquired from the mobile devices, further includes respective time-stamps, whereby the orientation and other inertial sensor data, the magnetic field strength and direction, the received wireless signal strength, the barometric pressure, and the position data can be time-correlated with respect to any given position along a trajectory or trajectory segment of the mobile devices, in accordance with the respective time-stamps. Additionally, given that sampling times and sampling rates applied to particular ones of device sensors 205 may be different, the signal and sensor information as measured may be time-averaged across particular periods of time, with the time-averaged value being used to represent the signal information at any given instance of time within that particular period of time in which the signal information is time-averaged.

At step 420, accumulating received signal strength (RSS) measurements in forming a RSS fingerprint map using crowd sourced RSS measurements during the deploying. a distribution of calibrated data points based at least in part on the first set of fingerprint data, the calibrated data points representing respective positions within the area, which may be an indoor area, in embodiments. The terms "position" and "location" as used herein refers to a coordinate location, and may be expressed in local or global (X, Y) coordinate terms.

At step 430, switching, responsive to identifying desirability of a change in the mobile device localization within the indoor area, from the crowd sourced magnetic fingerprint map to the RSS fingerprint map as basis for localizing the mobile device.

In one embodiment, using the executable instructions of fingerprint map change module 313, when the updated distribution of RSS fingerprint exceeds a predetermined threshold density of calibration RSS data points, deploying the updated distribution as the calibrated positioning map of the area. In another embodiment, the threshold RSS data points density for deployment may be dynamically determined, and dynamically updated. Dynamically updating the threshold RSS data points density in the latter manner allows the system to automatically detect and correct potential calibration inconsistencies prior to deploying the calibrated RSS positioning map of the indoor area. A density determination algorithm may be applied, in one embodiment, to establish the predetermined threshold RSS density based on validating the updated distribution of calibrated data points as sufficient for deployment representing the calibrated RSS fingerprint map of the area, for mobile devices localization during traversal or navigation within or near the indoor area.

In embodiments, the crowd sourced magnetic fingerprint map comprises a magnetic field measurement at respective ones of a plurality of locations within the indoor area.

In embodiments, the magnetic field measurement is at least one of a magnetic field strength, a magnetic direction and a magnetic dip angle.

In embodiments, the magnetic field measurement is obtained at least in part based on a magnetometer device.

In embodiments, during the deploying, mobile device localization is performed primarily using the magnetic fingerprint map.

In embodiments, the accumulating comprises correlating the RSS measurements to respective locations as identified in accordance with the magnetic fingerprint map.

In embodiments, the magnetic fingerprint map and the RSS fingerprint map include respective time-stamps, whereby measurements of magnetic field strength, direction, dip angle and received wireless signal strength include correlations in accordance with the respective time-stamps.

In embodiments, identifying desirability of a change comprises a determination that mobile device localization based on the magnetic fingerprint map has dropped below a desired accuracy threshold.

In embodiments, identifying desirability of a change comprises a determination that a data density of the RSS fingerprint map has exceeded a predetermined data density threshold.

It is contemplated for embodiments described herein to extend to individual elements and concepts described herein, independently of other concepts, ideas or system, as well as for embodiments to include combinations of elements recited anywhere in this application. Although embodiments are described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mention of the particular feature. Thus, the absence of describing combinations should not preclude the inventor from claiming rights to such combinations.

What is claimed is:

1. A method for deploying a positioning fingerprint map of an indoor area, the method executed in a processor of a server computing device and comprising:
    deploying a crowd sourced magnetic fingerprint map for mobile device localization during traversal of the indoor area;
    localizing a mobile device in the indoor area based on the crowd sourced magnetic fingerprint map;
    accumulating received signal strength (RSS) measurements in forming an RSS fingerprint map using crowd sourced RSS measurements, based on the localizing; and
    switching, responsive to identifying desirability of a change in the mobile device localization within the indoor area, from the crowd sourced magnetic fingerprint map to the RSS fingerprint map as basis for localizing the mobile device.

2. The method of claim 1 wherein the crowd sourced magnetic fingerprint map comprises a magnetic field measurement at respective ones of a plurality of locations within the indoor area.

3. The method of claim 2 wherein the magnetic field measurement is at least one of a magnetic field strength, a magnetic direction and a magnetic dip angle.

4. The method of claim 2 wherein the magnetic field measurement is obtained at least in part based on a magnetometer device.

5. The method of claim 1, wherein during the deploying, mobile device localization is performed primarily using the magnetic fingerprint map.

6. The method of claim 1 wherein the accumulating comprises correlating the RSS measurements to respective locations as identified in accordance with the magnetic fingerprint map.

7. The method of claim 1 wherein the magnetic fingerprint map and the RSS fingerprint map include respective time-stamps, whereby measurements of magnetic field strength, direction, dip angle and received wireless signal strength include correlations in accordance with the respective time-stamps.

8. The method of claim 1 wherein identifying desirability of a change comprises a determination that mobile device localization based on the magnetic fingerprint map has dropped below a desired accuracy threshold.

9. The method of claim 1 wherein identifying desirability of a change comprises a determination that a data density of the RSS fingerprint map has exceeded a predetermined data density threshold.

10. The method of claim 9 wherein a density determination algorithm establishes the predetermined data density threshold based on validating the updated distribution of calibrated RSS data points as sufficient for deployment as the calibrated RSS fingerprint map of the indoor area.

11. A server computing system for deploying a calibrated positioning map of an indoor area, the server computing system comprising:
- a processor;
- a memory storing a set of instructions, the instructions executable in the processor to:
  - deploy a crowd sourced magnetic fingerprint map for mobile device localization during traversal of the indoor area;
  - localize a mobile device in the indoor area based on the crowd sourced magnetic fingerprint map;
  - accumulate received signal strength (RSS) measurements in forming an RSS fingerprint map using crowd sourced RSS measurements; and
  - switch, responsive to identifying desirability of a change in the mobile device localization within the indoor area, from the crowd sourced magnetic fingerprint map to the RSS fingerprint map as basis for localizing the mobile device.

12. The system of claim 11 wherein the crowd sourced magnetic fingerprint map comprises a magnetic field measurement at respective ones of a plurality of locations within the indoor area.

13. The system of claim 12 wherein the magnetic field measurement is at least one of a magnetic field strength, a magnetic direction and a magnetic dip angle.

14. The system of claim 12 wherein the magnetic field measurement is obtained at least in part based on a magnetometer device.

15. The system of claim 11, wherein during the deploying, mobile device localization is performed primarily using the magnetic fingerprint map.

16. The system of claim 11 wherein the accumulating comprises correlating the RSS measurements to respective locations as identified in accordance with the magnetic fingerprint map.

17. The system of claim 11 wherein the magnetic fingerprint map and the RSS fingerprint map include respective time-stamps, whereby measurements of magnetic field strength, direction, dip angle and received wireless signal strength include correlations in accordance with the respective time-stamps.

18. The system of claim 11 wherein identifying desirability of a change comprises a determination that mobile device localization based on the magnetic fingerprint map has dropped below a desired accuracy threshold.

19. The system of claim 11 wherein identifying desirability of a change comprises a determination that a data density of the RSS fingerprint map has exceeded a predetermined data density threshold.

20. The system of claim 19 wherein a density determination algorithm establishes the predetermined data density threshold based on validating the updated distribution of calibrated RSS data points as sufficient for deployment as the calibrated RSS fingerprint map of the indoor area.

* * * * *